United States Patent
Chen et al.

(10) Patent No.: US 9,275,721 B2
(45) Date of Patent: Mar. 1, 2016

(54) SPLIT BIT LINE ARCHITECTURE CIRCUITS AND METHODS FOR MEMORY DEVICES

(75) Inventors: Yi-Tzu Chen, Hsin-Chu (TW); Bin-Hau Lo, Hsin-Chu (TW); Tsai-Hsin Lai, Jhubei (TW); Pey-Huey Chen, Baoshan Township (TW); Hau-Tai Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 12/847,647

(22) Filed: Jul. 30, 2010

(65) Prior Publication Data
US 2012/0026818 A1 Feb. 2, 2012

(51) Int. Cl.
*G11C 11/40* (2006.01)
*G11C 11/4097* (2006.01)
*G11C 5/06* (2006.01)

(52) U.S. Cl.
CPC ............ *G11C 11/4097* (2013.01); *G11C 5/063* (2013.01)

(58) Field of Classification Search
CPC .......................... G11C 11/4097; G11C 5/063
USPC ............................. 365/51 X, 207 O, 51, 207
See application file for complete search history.

(56) References Cited

U.S. PATENT DOCUMENTS

| | | | | |
|---|---|---|---|---|
| 4,627,031 A * | 12/1986 | van Tran | | 365/190 |
| 4,649,301 A * | 3/1987 | Van Tran | | 327/53 |
| 5,966,315 A * | 10/1999 | Muller et al. | | 365/51 |
| 6,768,663 B2 * | 7/2004 | Ogata | | 365/63 |
| 2007/0263423 A1 | 11/2007 | Scheuerlein et al. | | |
| 2008/0031029 A1 * | 2/2008 | Liaw | | 365/63 |

FOREIGN PATENT DOCUMENTS

| CN | 1702770 A | 11/2005 |
|---|---|---|
| KR | 20070049266 A | 5/2007 |
| KR | 100824798 B1 | 4/2008 |

* cited by examiner

*Primary Examiner* — Vanthu Nguyen
(74) *Attorney, Agent, or Firm* — Slater & Matsil, L.L.P.

(57) ABSTRACT

Apparatus and methods for providing a high density memory array with reduced read access time are disclosed. Multiple split bit lines are arranged along columns of adjacent memory bit cells. A multiple input sense amplifier is coupled to the multiple split bit lines. The loading on the multiple split bit line is reduced, and the corresponding read speed of the memory array is enhanced over the prior art. The sense amplifier and the memory bit cells have a common cell pitch layout height so that no silicon area penalty arises due to the use of the multiple split bit lines and sense amplifiers. Increased memory array efficiency is achieved.

18 Claims, 8 Drawing Sheets

SPLIT BIT LINE ARCHITECTURE CIRCUITS AND METHODS FOR MEMORY DEVICES

TECHNICAL FIELD

The present invention relates to the use of bit lines in memory devices such as are used in integrated circuits. The bit lines are used to receive data stored in memory cells as stored charge, and are coupled to a small signal sensing amplifier where the signals are amplified to full signal levels and output for use by other circuits in the integrated circuit or system.

BACKGROUND

A current common requirement for an advanced electronic circuit and particularly for circuits manufactured as integrated circuits ("ICs") in semiconductor processes is the use of embedded or discrete memory devices. Increasingly these memory devices are provided as a macro or portion of an integrated circuit and manufactured on a substrate along with other circuitry such as user defined logic circuitry, microprocessors, microcontrollers, digital signal processors and the like to provide a highly integrated circuit in a single package. Embedded memory arrays may be formed as dynamic random access memories (DRAMs) or increasingly as static random access memories (SRAMs). While DRAM cells require less silicon area per stored bit, the DRAM cells require sophisticated memory controllers to perform the periodic refresh cycles needed to maintain the data over time. In contrast, while SRAM cells require more silicon area per stored bit, the SRAM cells will maintain the data without the need for refresh cycles and therefore are better suited for some embedded applications. As alternatives, non volatile memory cells such as FLASH or EEPROM cells may also be embedded with other circuitry.

In order to make a memory cell as small as possible and to make read and write cycles as fast as possible, memory cells are created using small signal approaches. A capacitive charge is stored in the cell either in a discrete capacitor such as for a DRAM cell, or using the gate capacitors and the latching action of cross coupled inverters, such as for an SRAM cell. By keeping the signal levels small, the cell may be rapidly read from and written to.

However, the small signals on the bit lines are not useful by other logic circuitry and so these small signal levels are usually converted to full logic signals in the input/output circuitry of a memory array. This function is performed through the use of differential sense amplifiers. These differential sense amplifiers sense a small signal difference between an active bit line, which is coupled to a selected memory cell, and another bit line, which is not selected and so maintains a level voltage. The differential voltage is used to cause the sense amplifier to put out a voltage corresponding to a logical "1" or logical "0" depending on the stored bit in the cell. Typically a cell storing a logical "1" will leave the bit line undisturbed, while a cell storing a logical "0" will discharge, or lower the voltage on, the respective bit line, causing a small voltage drop. The small voltage drop is then sensed by the differential sense amplifier.

The read speed of a memory device is a critical characteristic of a high density memory array performance. The speed for a read cycle is determined in part by the time required for a bit cell to discharge the nominal voltage on the bit line. If the bit lines are particularly long and/or heavily loaded, that is, the bit lines have many memory cells coupled to them, the read time may become unacceptably long.

Figure 1:
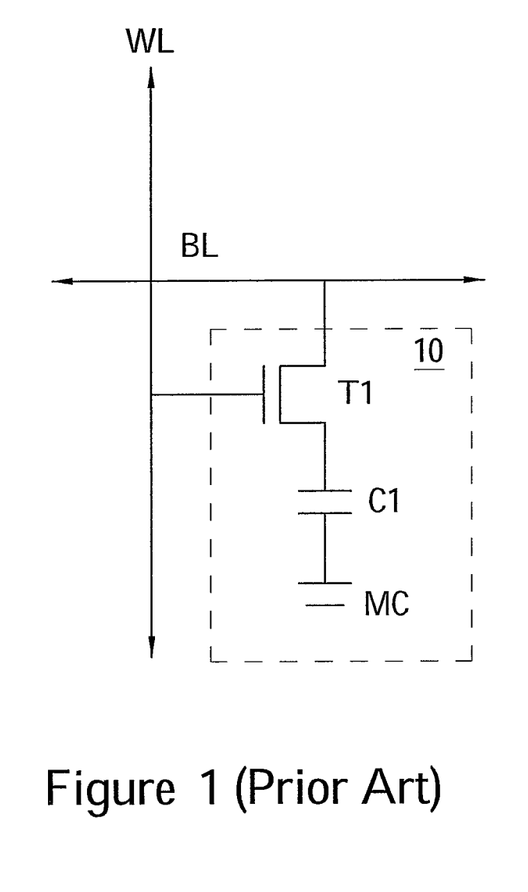
FIG. 1 depicts in a simple circuit schematic a single transistor memory cell of the prior art.

FIG. 1 depicts a simple DRAM cell 10 of the prior art. An access transistor T1 is coupled with its gate input coupled to a word line WL. Although not visible in the figure the word line WL will be coupled to many other memory cells along its length. When the word line WL goes active (that is when a rising voltage is supplied on the word line) the access transistor T1 turns on and couples one plate of the storage capacitor C1 to the bit line BL. Although the bit line BL is also coupled to other memory cells, the memory array is arranged so that in a given cycle only one memory cell is active on a particular bit line. As can be seen from the figure, if the capacitor C1 is charged, storing data representing, for example, a logical "1", the bit line which begins the memory cycle in a "pre-charged" state, will remain at a high voltage level. If on the other hand the capacitor C1 is discharged, meaning it is storing data representing a logical "0" then as the word line goes active and the transistor T1 couples the memory cell to the bit line, a charge sharing event occurs and the bit line voltage will fall slightly as the capacitor C1 takes charge from the bit line. This will put a lower voltage, representing a logical "0", on the bit line.

Because the sense amplifiers used in typical memory devices are small signal sense amplifiers, during a read cycle the bit line voltages are moved only slightly below a pre charged voltage, or not changed at all. The use of two bit lines, one active and one inactive, input into a logical gate sense amplifier or a differential pair sense amplifier, enables fast sensing of the read data. It is not necessary to wait for the bit line to reach a full high or full low logic voltage to obtain the data, instead the small signal difference is detected and the sense amplifier, which outputs a full logical level voltage, amplifies this value to a logic level voltage for use by other circuits in the device.

Figure 2:
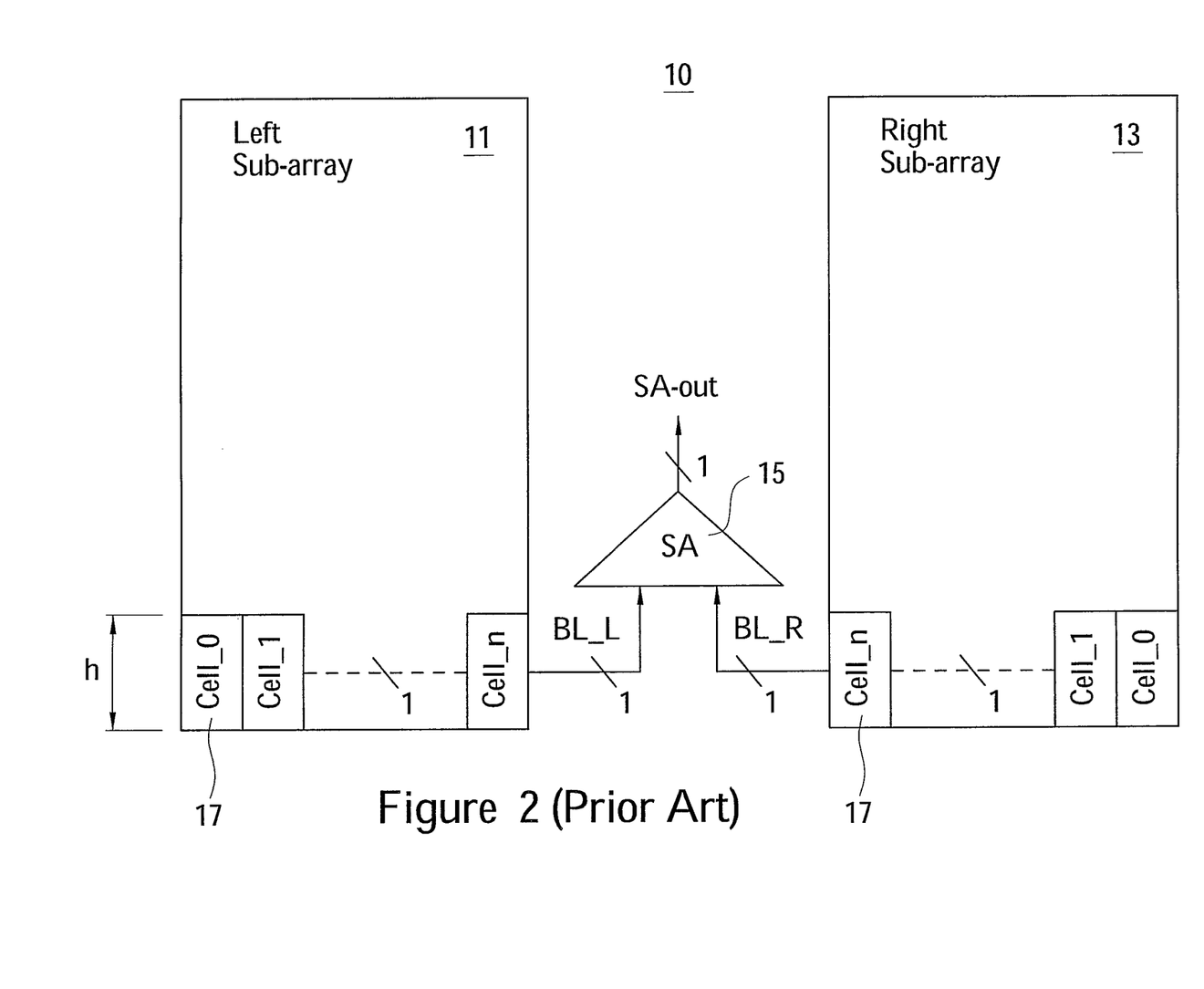
FIG. 2 depicts in a simple block diagram a memory array circuit of the prior art.

FIG. 2 depicts an exemplary prior art memory array architecture. As is known to those skilled in the art, memory arrays may vary widely in size and may include millions of bit cells, for example a 16 megabyte memory has 16 million cells. These may be arranged in many sub-arrays and each of those may be further divided. The use of illustrative embodiments in this description which depict, for ease of understanding, only a few bit cells is not limiting on the discussion, or the embodiments of the invention.

In FIG. 2 the illustrative memory array is divided simply into two sub-arrays, a left sub-array 11 and a right sub-array 13. There are bit lines coupled to a sense amplifier 15 which may be positioned, for example, in a central portion between the two sub-arrays, forming part of a local input/output or "local I/O" circuit. The sense amplifier 15 is shown implemented as a differential signal sense amplifier with bit lines and cells arranged running right to left. In some prior art literature the bit lines are referred to as forming "columns" and the word lines are said to form "rows" of cells which are arranged along the word lines. In using a memory array, data words are usually input to, and output from, the memory. A data word has a word width; it might be 16 bits, 32 bits, 64 bits, 128 bits. The word line, when active, will cause the cells that form a word at a selected row to become active. There will be a sense amplifier for each bit, or each column, in the data word. Each sense amplifier is coupled to an active bit line and also to an inactive one to form the differential voltage comparison needed to sense the small signal voltage. In a memory read operation, the bit lines are first precharged to a nominal voltage. Often, to reduce the power and speed the transitions of the bit lines, the precharge voltage is substantially less than a nominal positive supply voltage, for example precharge voltages such as Vdd/2, or some other reduced voltage, might be used.

The sense amplifier can sense a difference voltage of as little as a few millivolts. The use of small signal voltages on the differential bit lines can reduce the size of the storage capacitor needed, and speed up the read access time for the memory. However the small signals used have to be selected to be large enough to prevent data read errors, and to overcome noise and coupling signals from adjacent bit lines, for example.

Because memory arrays can be physically laid out in any fashion including folded and mirror image arrangements, the terms "rows" and "columns" do not really describe orthogonal arrangements, even though in the simple schematic views such as the ones used here the column or bit lines and row or word lines are usually drawn in this manner. In a physical implementation the bit lines and word lines can be in parallel, orthogonal, or arranged at any angle to each other. The figures presented here are simplified schematic views that are used to discuss the circuit, but which do not reflect the manner or in any way limit the manner of a physical implementation of the device.

In FIG. 2, there are "n+1" memory cells ranging from Cell_0 to Cell_n in each sub-array arranged along each bit line position, each cell is coupled to one of the corresponding bit lines, the left or the right bit lines BL_L and BL_R. For very large memory arrays (high density memory devices) the bit lines can become quite long, and an additional capacitive loading occurs for the extra length of the physical conductor that forms the bit line and for each added memory cell that is coupled to the bit line. During a read operation, because the selected memory cells must discharge or "charge share" with the bit lines in order to change the voltage on the bit lines, the capacitance on the bit line is critical to the amount of time it takes the cell to change the bit line voltage and therefore to put data on the bit lines. As the bit line capacitance increases, the time needed to perform a memory read access cycle also increases, and for larger memory arrays this read access time may become unacceptably long.

One skilled in the art will recognize that the bit line length and loading effects occur with all types of memory cells. The example DRAM type cells of FIG. 1 are easily the smallest memory cells; however, they also impose additional timing requirements on an integrated circuit. The read cycle for a DRAM cell must also include a "write back" cycle, because the DRAM reads are destructive (the cell discharges the bit line directly which changes the state of the cell, so to maintain the data, the DRAM cell must be rewritten to restore it to the original state.) For reliable operation, the DRAM cells also have to be "refreshed" fairly frequently, a refresh is a read, followed by a write back, of all of the cells. This refresh of dynamic memory is performed periodically; else the stored data can be lost due to capacitor leakage from the cell storage capacitors. An integrated circuit with embedded memory must also include support logic that performs these time critical operations.

Accordingly, other memory cells for storage are increasingly typically used, such as six transistor (6T) or eight transistor (8T) static RAM cells. These SRAM cells form a latch that is constantly supplying power to the stored capacitive charge, and thus they do not require refresh cycles. The use of SRAM cells imposes less timing requirements on the integrated circuit or system. Read cycles of SRAM cells are also not destructive. The static characteristic of these cells may be particularly important in applications for battery powered devices, where, in order to extend battery life, integrated circuits often go into "standby" or "sleep modes", in those modes DRAM cells are not able to retain data, so an SRAM memory array is a more attractive option. However, the silicon area per bit for an SRAM cell is somewhat higher than for a DRAM cell, simply because the number of transistors is larger (6T for SRAM, vs. 1T for DRAM).

Regardless of the type of memory cell used, the memory arrays are increasing in capacity, and thus in physical size, which tends to increase the length of the bit lines, and also the number of cells attached to a bit line.

Figure 3:
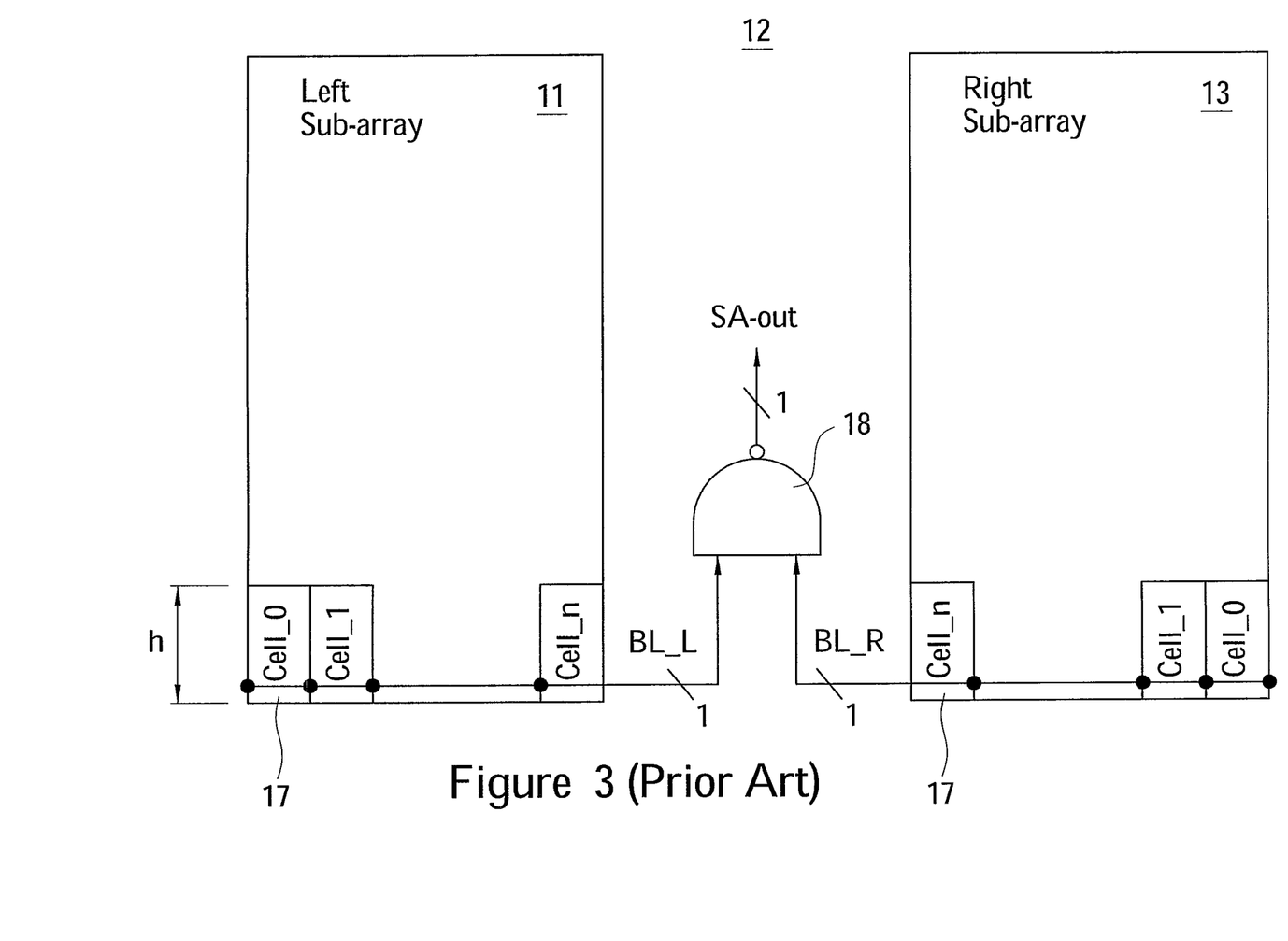
FIG. 3 depicts in a simple block diagram an alternative memory array circuit of the prior art.

FIG. 3 depicts in a simple schematic view another prior art example memory architecture. Here the memory device 12 uses a different type of sense amplifier 18. In this example, a single ended logic gate sense amplifier 18 is used. The remaining elements of the memory array are again arranged as shown in FIG. 2, and like reference numerals are used for the left sub array 11, the right sub array 13, and the cells 17 which again have a cell pitch height "h". As shown in FIG. 3, the sense amplifier 18 performs a logical NAND function, that is, the data output signal "SA-out" will be a high value when either input, whether from the left bit line BL-L or the right bit line BL-R, is a low voltage.

In a memory operation, the bit lines BL_L and BL_R are first precharged to a higher (although not necessarily a full positive voltage supply level) voltage before the memory cycle begins. The memory cell selected will either leave the bit line voltage undisturbed, or slightly discharge the bit line to a lower voltage. In this way the active bit line may be a small differential voltage that represents a "1" (typically, this bit line voltage is at or above the pre-charge voltage level) or a "0" (typically, the bit line voltage is slightly lowered from the precharge level), while the inactive or unselected bit line remains at the nominal precharge voltage. This characteristic of pairing a selected bit line with an unselected bit line allows the detection of the small signal voltage difference between the two bit lines. In this sense the NAND gate acts as a logical comparator and outputs a "1" when a voltage difference is detected between the two bit lines BL_L and BL_R. Since only one of the two bit lines is active, the data from the active bit line is thus correctly sensed, and amplified onto the "SA-out" data signal. The output signal is a full logic voltage so that other circuitry can correctly receive it. Thus, a sense amplifier first "senses" the small signal voltage and then "amplifies" it to an output.

An important characteristic of the sense amplifiers used in memory arrays is that they should be physically configured for a dense memory layout. A distance "h", shown in both FIGS. 2 and 3, represents the bit cell pitch in one direction for the memory cells arranged in an adjacent manner to form a column; "h" is the cell pitch "height". In order to compactly lay out the memory array, the sense amplifiers, one of which will be provided for each bit line column, should have a pitch height that is the same or less than the memory cells. By keeping the pitch regular, the memory array may be densely compacted, the lay out is regular and orderly, and the memory array uses silicon area as efficiently as possible.

One approach known in the art to shorten bit line swing times is to add additional sense amplifiers for each column, and to divide the bit lines into segments; however, this approach reduces the layout efficiency obtained, as the added sense amplifiers don't fit in the regular cell pitch structure defined by the cell pitch height, and so while some speed benefit in bit line swing time may be obtained, the disadvantages created by the extra silicon area penalty when these divided bit lines are used are undesirable.

In the typical prior art memory devices, the long bit lines that result from the memory array architectures in high density memory arrays greatly increases the time needed for a memory read access. As a result read speeds for the high density memory arrays are undesirably slow. These problems are increasing as memory array density (the number of bits) increases.

A continuing need for memory bit line architectures that provide reduced bit line loading and fast read access times in large memory arrays, and for methods for these memory devices that reduce or eliminate the problems associated with the prior art circuits and methods thus exists.

SUMMARY

These and other problems are generally solved or circumvented, and technical advantages are generally achieved by embodiments of the present invention, which provides memory array architectures with multiple split bit lines formed within a single cell pitch height. The multiple split bit lines are coupled to sense amplifiers arranged to receive multiple inputs while still having a layout area within a single cell pitch. The sense amplifies may be differential sense amplifiers or a single ended logical gate sense amplifier. The read access time for the memory arrays with the multiple split bit lines per column of bit cells is reduced. No silicon area penalty is created by use of the embodiments. The bit cells may be any type of memory cell, including SRAM and DRAM cells.

This summary gives an overview of certain embodiments of the invention, and is not limiting. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention which are now described in detail provide novel circuits and methods for high density memory arrays. The use of the embodiments enables reduction in the read access time for the memory cells, by reducing the bit line loading, without a corresponding silicon area penalty.

Figure 4:
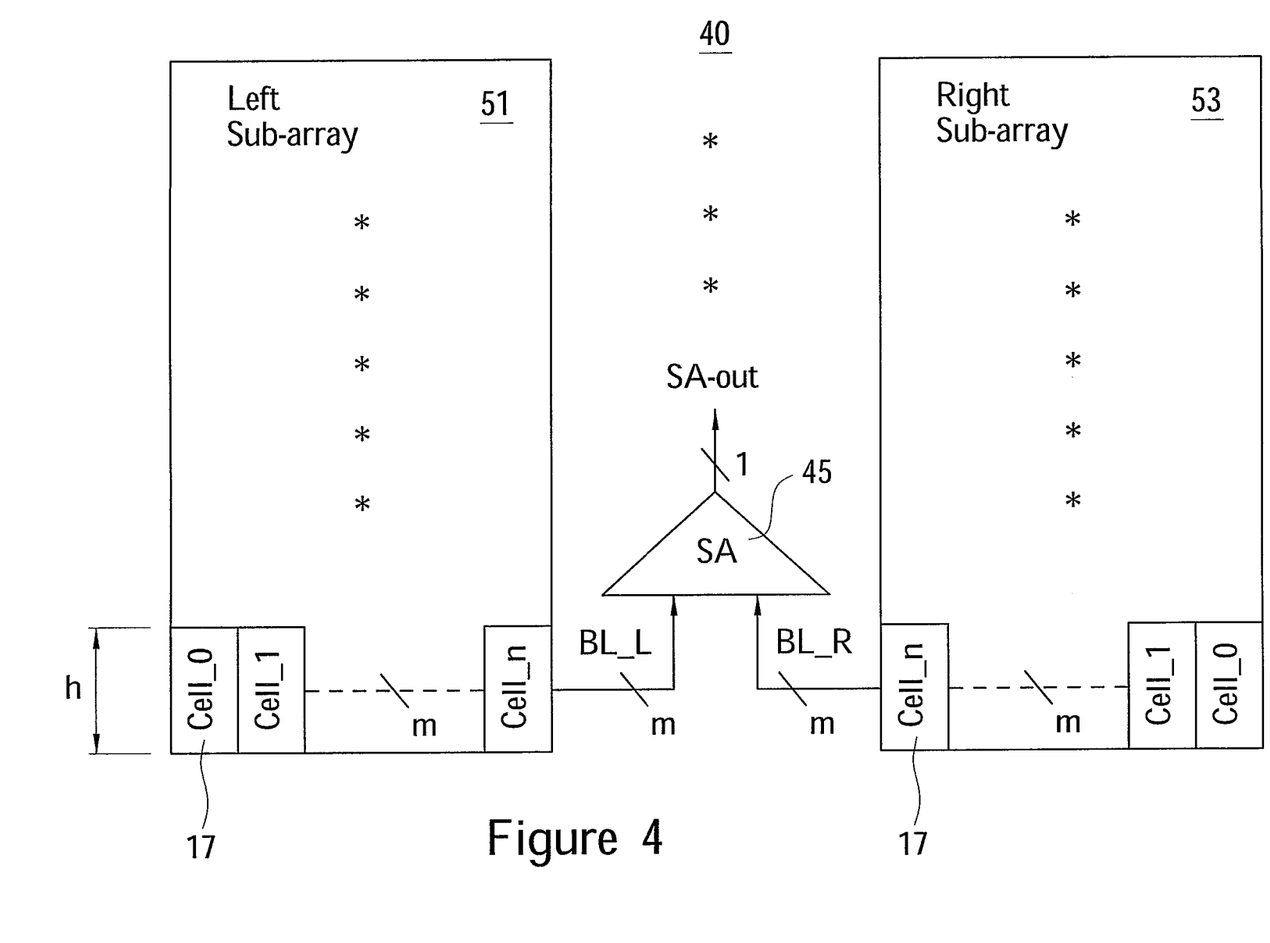
FIG. 4 depicts in a simple block diagram an exemplary embodiment memory array circuit of the present invention.

FIG. 4 depicts in a first exemplary embodiment a memory array 40. A left sub array 51 and a right sub array 53 are depicted. In each sub array, multiple adjacent memory cells 17 are arranged in columns. Although not shown, each instance of the columns of cells, the bit lines BL_L and BL_R, and the sense amplifier 45 is repeated throughout the array, as indicated by the asterisks in FIG. 4. Each bit line column is coupled to a sense amplifier.

In the embodiment of FIG. 4, each sense amplifier 45 is coupled to receive "m" bit lines from the corresponding left side or right side column of memory cells. The "m" bit lines may be coupled to one or more bit cells, and the number of cell coupled to each of the "m" bit lines may be the same, or, different. In a simple embodiment example, each bit line is coupled to a single memory cell in the column. The swing times, or data transition times for the bit lines may be varied by varying the number of cells coupled to the bit lines, to ensure the swing times are closely correlated among the "m" bit lines. Each of the bit lines on the right and left side of the sense amplifiers, which are typically provided in a central area although the embodiments are not so limited, has "m" bit lines as an input where "m" is an integer greater than 1.

Importantly, the sense amplifier 45 in the embodiment of FIG. 4 is configured so that the sense amplifier still fits an area having a single cell pitch height "h", so that for the memory array circuit, the physical layout packing density is kept efficient, the use of the bit lines and sense amplifier of the embodiment does not significantly increase silicon area over the single bit line, simple sense amplifier arrangement of the prior art, as shown in FIG. 2. In contrast to the prior art, the sense amplifier is coupled to multiple bit lines in the same column, each with a smaller loading, and thus faster swing time, than the simple single bit line approach of the prior art.

Figure 5:
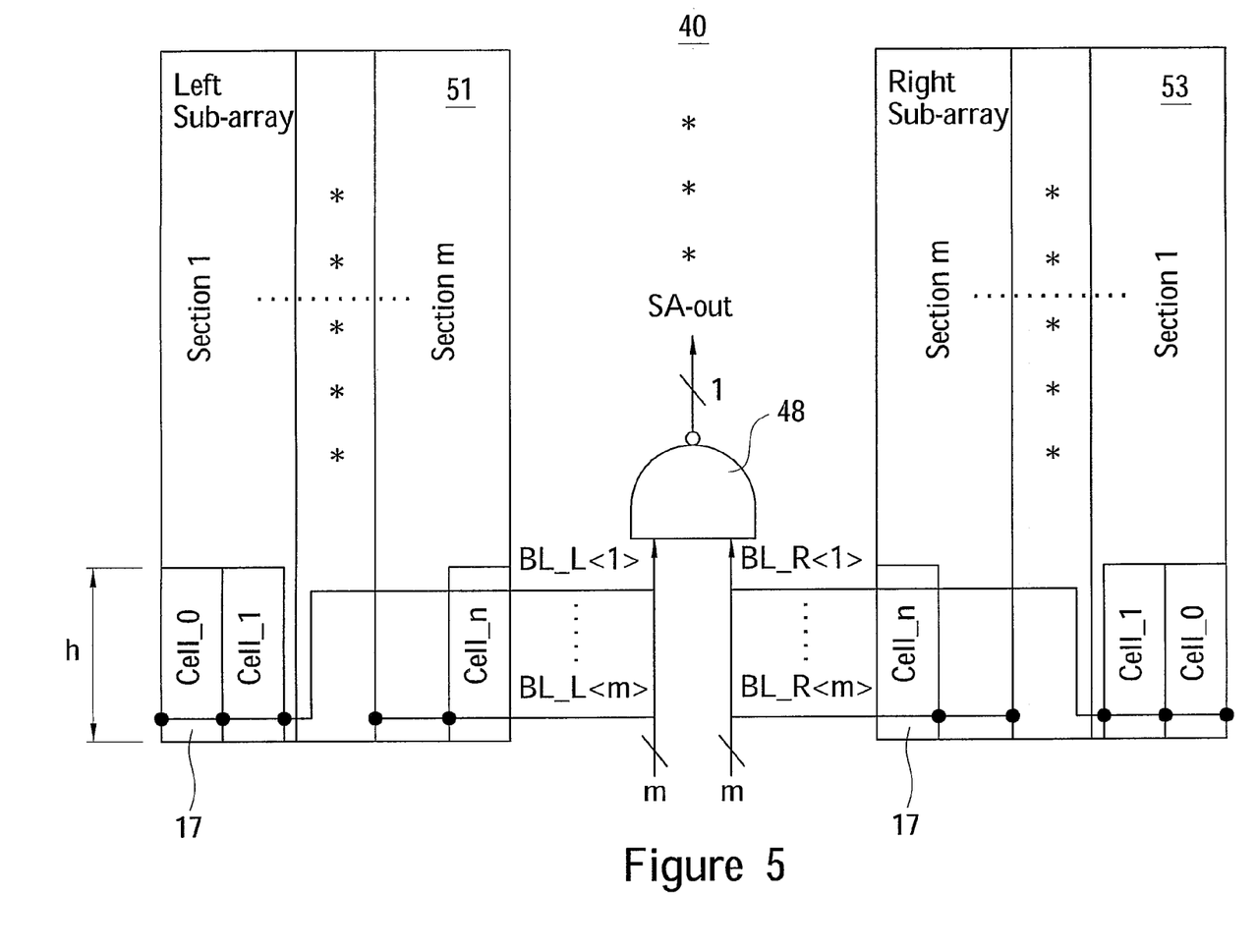
FIG. 5 depicts in another simple block diagram an alternative exemplary embodiment memory array circuit of the present invention.

FIG. 5 depicts in another simple circuit schematic an alternative embodiment. In FIG. 5, the sub-arrays of memory cells 51 and 53 for the left sub-array and the right sub-array, respectively, are further divided into sections 1 to m. A bit line section is coupled to the bit cells in each of these sections, as shown, for example BL_L<1> is coupled to the section 1 bit cells in left sub-array 51. The sense amplifier is coupled to receive m bit line sections, however only one bit cell in the column will be active so the sense amplifier can sense the data on the active bit line, the remaining bit lines will remain at the precharge voltage level during a read operation.

Figure 6:
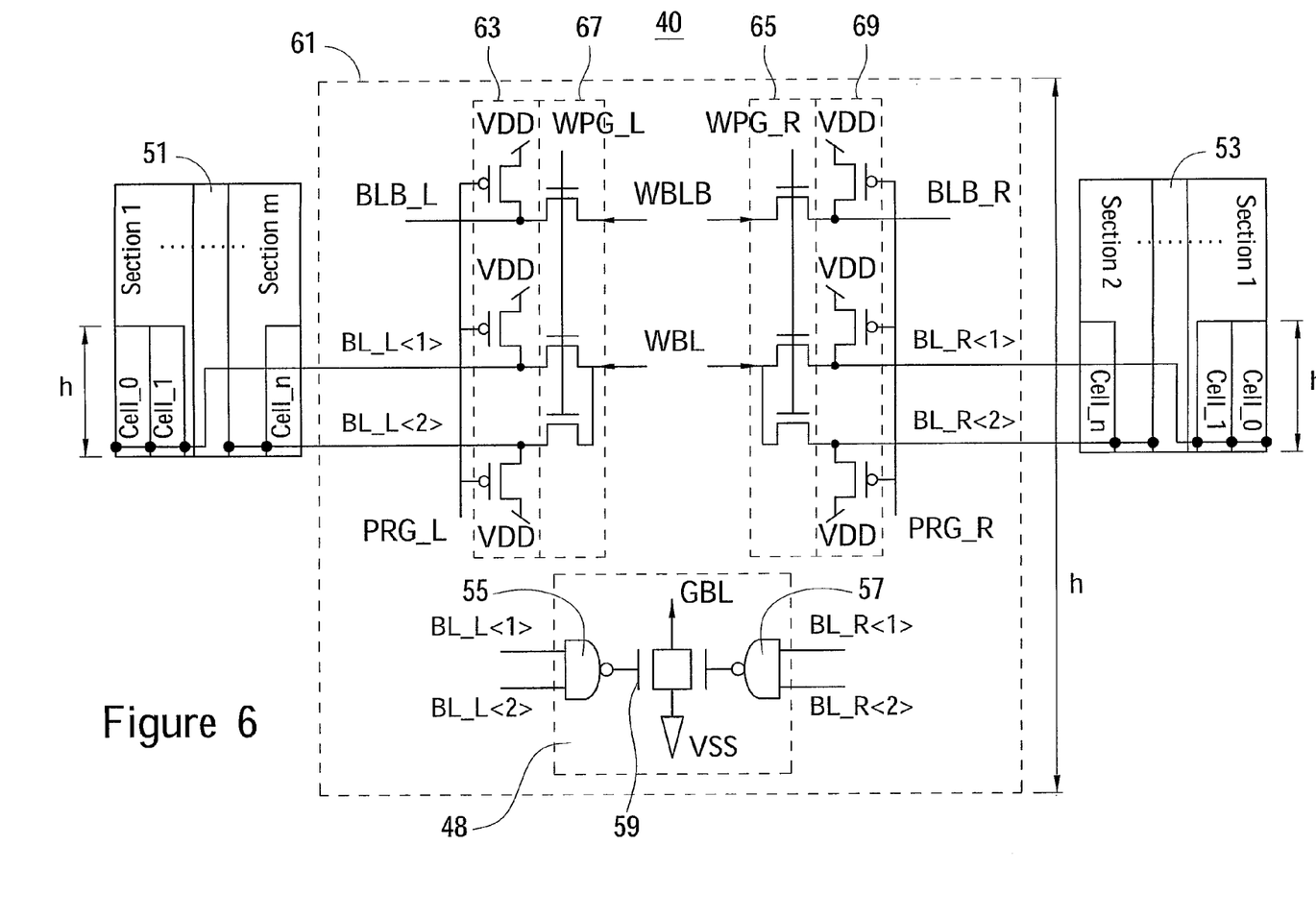
FIG. 6 depicts in another simple block diagram a detailed circuit embodiment of the local input output circuit of the present invention.

FIG. 6 depicts in detail the local I/O circuitry used with the exemplary embodiments, including the sense amplifiers.

Memory array 40 is again shown in a simple circuit diagram and is divided into two main sub-arrays 51, the left side sub-array, and 53, the right side sub-array. Each of the sub arrays is further configured into sections, Section 1 and Section 2, in this exemplary illustrative embodiment, although many more sections could be provided in a practical device. In the local I/O circuit 61, circuitry is provided to precharge the bit lines, to couple the global (GBL) read and write bit lines (WBL and WBLB) to the arrays of cells, and to sense and amplify the local bit lines BL_L and BL_R.

In FIG. 6, local I/O 61 includes the left precharge transistors 63, which are active when the control input PRG_L (precharge left) is active. This input signal causes the transistors 63, shown here as p type pull-up transistors, to put a positive precharge voltage such as VDD or a lower supply voltage on the bit lines. Also, the right side bit lines are precharged by precharge transistor 69 responsive to the precharge signal PRG_R.

In FIG. 6, local I/0 circuit 61 also includes the write select transistors 67 for the left side and 65 for the right side. During a write cycle, input data from the external inputs and WBLB to the memory array are coupled to the bit lines BL_L and BL_R responsive to a write control input, WBL, WPG_L and WPG_R. During a write cycle this write data is placed onto the local bit lines, and the active word line causes the access transistor to cause selected bit cells along that word line to be overwritten with the write data.

Sense amplifier 48 is shown in detail in FIG. 6. Sense amplifier 48 receives the split bit lines from each section into logical gates such as 55 and 57. The transistor circuit 59 then combines the outputs of the two NAND gates. Since only one of the two NAND gates will be coupled to an active split bit line during a particular read cycle, the global bit line GBL will receive the data from the appropriate left or right sub-array.

Importantly, as shown in FIG. 6, the pitch height "h" of the local I/O cell 61 is the same as the bit cell pitch height "h". This means that although the split bit lines BL_L<1> and BL_L<2> for example are loaded less than the bit line of the prior art and thus have a faster swing time, the silicon area used in implementing the memory array incorporating the embodiments of the invention is not increased substantially over the prior art, and an efficient silicon area layout is enabled by ensuring the local I/O circuit, which is repeated for each column of bit cell in the memory array, is easily laid out in the bit cell pitch area.

Figure 7:
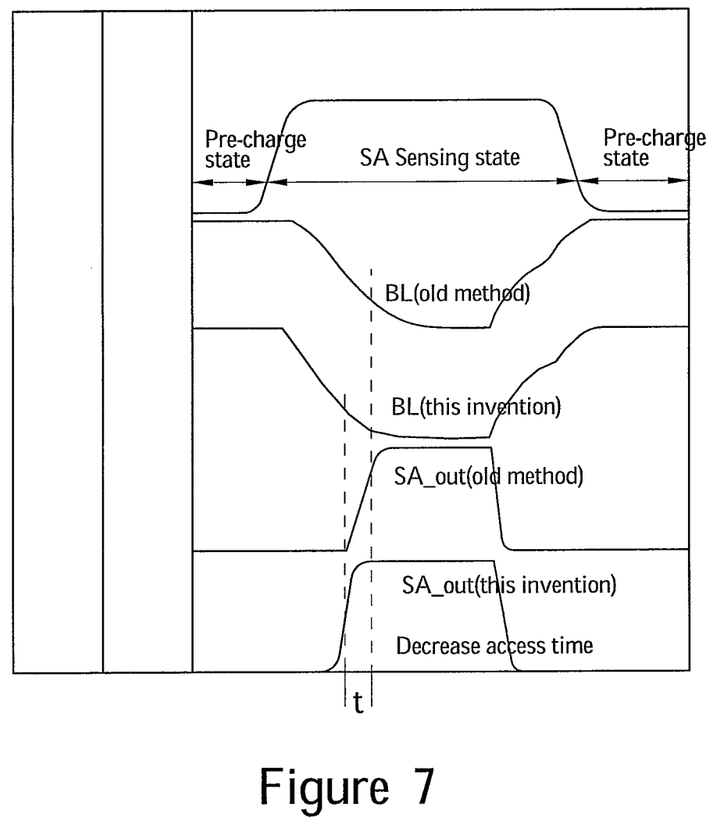
FIG. 7 depicts, in a timing diagram, the timing for an exemplary embodiment of a memory array circuit using the invention, and for comparison, the timing for a prior art memory array.

FIG. 7 illustrates the advantages obtained using an embodiment of the invention memory circuit over the prior art. In FIG. 7, a timing diagram for a memory read access is shown. Waveforms depicting simulated results for a prior art memory array and a memory array implemented using the split bit lines and multiple input sense amplifiers of the exemplary embodiments are illustrated. In FIG. 7, the top waveform illustrates the voltages on a word line (WL). Prior to the word line going active, the bit lines are precharged as indicated by the "pre charge state" label on the top waveform WL. As the word line goes active, the sense amplifiers begin sensing data on the bit lines. The second waveform from the top is a simulated bit line waveform labeled "BL(old method)" for a prior art memory array. The third waveform from the top of FIG. 7 is a simulated waveform labeled "BL(this invention)". The fourth waveform from the top of FIG. 7 is the output of the sense amplifier for a prior art memory array, labeled "SA_out(old method)". Finally, the bottom waveform in the timing diagram is the output of a sense amplifier of an exemplary embodiment, labeled "SA_out(this invention)". As indicated by the time difference "t" in FIG. 7, the output of the sense amplifier using the exemplary embodiments is available at an earlier time than in the prior art arrays. This reflects a reduction or decrease in the memory read access cycle time. In other words, the exemplary embodiments provide a faster read cycle time.

Figure 8:
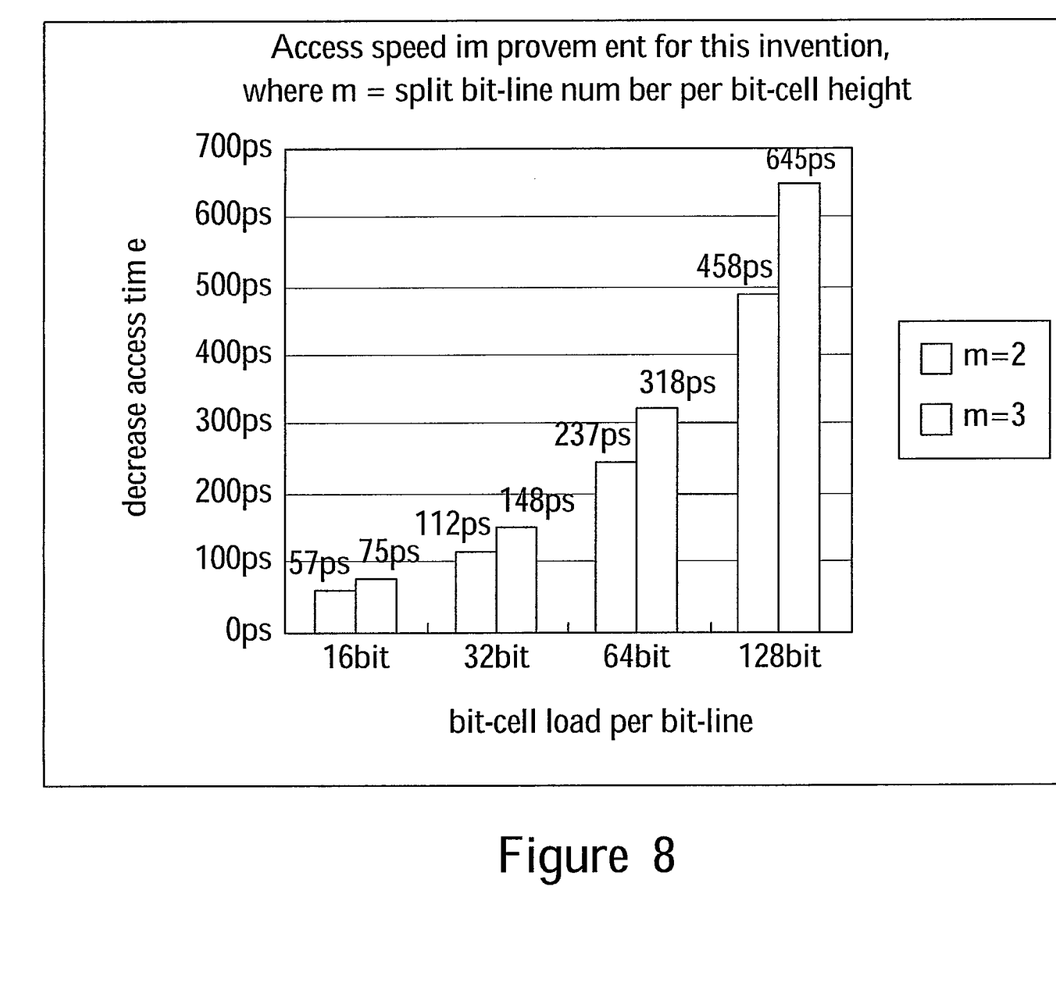
FIG. 8 depicts in a chart the decreased access time obtained for read access in an exemplary embodiment, when measured compared to a prior art memory array.

FIG. 8 depicts, in a side by side comparison chart, the amount of the decrease in the access time "t" for an embodiment produced in an exemplary semiconductor process node, using different arrangements of the exemplary methods. For example, for a 16 bit cell column (16 bit cells arranged along a bit line), the access time was reduced by 57 picoseconds for sub-arrays divided into two sections (m=2) and by 75 picoseconds for 3 sections (m=3). For a bit column with 128 bit cells arranged along a bit line, the reduction was more significant, 485 picoseconds for two sections (m=2) and 645 picoseconds for three sections (m=3).

The exemplary embodiments provide a fast read access memory array for high density memories by using multiple split bit lines and multiple input sense amplifiers. The sense amplifiers and local I/O circuits have a layout pitch height approximately the same as the memory cell layout pitch height so that no layout area penalty is imposed due to the use of the invention. The multiple split bit line architecture may be used with any type of memory cells, such as DRAM, SRAM cells including 6T and 8T cells, and other storage cells where bit lines and sense amplifiers are used. The use of the embodiments provide decreased read access time, increased read speed, save power due to faster bit line swing, and maintain speed for high density and large area memory arrays. The embodiments provide increased area efficiency and cell efficiency because it is not necessary to use the divided bit line schemes known previously to reduce read access time.

The embodiments provide m bit-lines per bit cell height, thus each sub array of bit cells can be further divided into m sections, where m is an integer greater than 1. In some embodiments each section may have the same number of cells coupled to the section bit line, in alternative embodiments that are also contemplated as part of the invention and within the scope of the appended claims, the use of sections having different numbers of bit cells may be used. The selection of the number of bit cells in a section may be made so as to keep the bit line swing times nearly equal for all of the sections.

The sense amplifier may have 2m inputs, m from the left side, and m from the right side. Alternatively, the sense amplifier may be divided into two m-input sense amplifiers, one for the left and one for the right side, and the outputs combined. A local I/O cell with the sense amplifier is provided for each column of bit cells and is arranged to have a pitch height the same, or less than, the pitch height of the bit cells in the column, so that an efficient use of silicon area is maintained.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A memory array, comprising:
memory bit cells being arranged in rows and columns with a common layout pitch height, the memory bit cells being divided into a plurality of sub-arrays, each column of each sub-array of memory bit cells being divided into a plurality of sections;
a plurality of split bit lines coupled to a single column of memory bit cells, each split bit line of the plurality of split bit lines being coupled to a single section of memory bit cells, each section in the single column of memory bit cells being coupled to a single split bit line; and
a sense amplifier coupled to the plurality of split bit lines and having more than two inputs for each of the plurality of sub-arrays, each input electrically connected to a section of memory bit cells by a split bit line of the plurality of split bit lines, the sense amplifier further comprising a first side logical gate comparator for comparing a plurality of split bit lines from a first sub-array of memory bit cells, and a second side logical gate comparator for comparing a plurality of slit bit lines from a second sub-array of memory bit cells, and a combination circuit for combining outputs of the first and second side logical gate comparators to form a global bit line signal on a global bit line, the combination circuit comprising a first transistor having a gate coupled to the output of the first side logical gate comparator and a second transistor having a gate coupled to the output of the second side logical gate comparator, drains of the first and second transistors being coupled together and to the global bit line, and sources of the first and second transistors being coupled together and to a VSS voltage supply.

2. The memory array of claim 1, wherein the plurality of split bit lines further comprises at least three split bit lines.

3. The memory array of claim 1, wherein the plurality of split bit lines comprises a number of split bit lines greater than three.

4. The memory array of claim 1, wherein the sense amplifier has a first side bit line input and a second side bit line input, and each of the first side bit line input and the second side bit line input is coupled to a plurality of split bit lines.

5. The memory array of claim 1, wherein the memory bit cells are static RAM cells.

6. The memory array of claim 1 wherein the memory bit cells are dynamic RAM cells.

7. An integrated circuit, comprising:
a memory array circuit in a portion of the integrated circuit having bit lines coupled to columns of memory bit cells with a common layout pitch height, comprising:
a plurality of sub-arrays, each having memory bit cells disposed adjacent one another along a column of the sub-array in a bit line direction;
a plurality of split bit lines corresponding to a column of memory bit cells and coupled to the memory bit cells in sections, each split bit line of the plurality of split bit lines being coupled to only one section of memory bit cells in the corresponding column of memory bit cells; and
a sense amplifier directly coupled to the plurality of split bit lines, the sense amplifier comprising a logical gate comparator comparing more than two split bit lines of the plurality of split bit lines from a single column of memory bit cells, the sense amplifier further comprising a first side logical gate comparator for comparing a plurality of split bit lines from a first sub-array of memory bit cells, and a second side logical gate comparator for comparing a plurality of split bit lines from a second sub-array of memory bit cells, and a combination circuit for combining outputs of the first and second side logical gate comparators to form a global bit line signal on a global bit line, the combination circuit comprising a first transistor having a gate coupled to the output of the first side logical gate comparator and a second transistor having a gate coupled to the output of the second side logical gate comparator, drains of the first and second transistors being coupled together and to the global bit line, and sources of the first and second transistors being coupled together and to a VSS voltage supply.

8. The integrated circuit of claim 7, wherein the memory bit cells comprise static RAM cells.

9. The integrated circuit of claim 7, wherein the memory bit cells comprise dynamic RAM cells.

10. The integrated circuit of claim 7, wherein the sense amplifier is disposed in an input output portion between the first sub-array and the second sub-array of memory bit cells, each of the first sub-array and the second sub-array having split bit lines coupled to memory bit cells arranged adjacent one another along a bit line column in the respective sub-array.

11. The integrated circuit of claim 7, further comprising additional user defined circuitry spaced from the memory array circuit.

12. A method, comprising:
providing a memory array comprising at least two sub-arrays, each of the at least two sub-arrays having columns of memory bit cells arranged adjacent one another in columns along a bit line direction;
dividing each of the columns of memory bit cells into m sections, wherein m is an integer greater than 2;
coupling m split bit lines to the m sections of memory bit cells in a single column of memory bit cells for receiving data from a selected one of the memory bit cells, each split bit line being coupled to a single section of memory bit cells;
coupling a multiple input sense amplifier to the m split bit lines and logically comparing the m split bit lines, the multiple input sense amplifier comprising a first NAND gate and a second NAND gate, the first NAND gate having m inputs electrically connected to respective m bit lines of a first sub-array of the at least two sub-arrays, the second NAND gate having m inputs electrically connected to respective m bit lines of a second sub-array of the at least two sub-arrays; and
detecting data in the multiple input sense amplifier from a selected memory bit cell and outputting a global bit line signal from the multiple input sense amplifier, wherein the detecting and outputting further comprises combining the outputs of the first and second NAND gates with a combination circuit to form the global bit line signal on a global bit line, the combination circuit comprising a first transistor having a gate coupled to the output of the first NAND gate and a second transistor having a gate coupled to the output of the second NAND gate, drains of the first and second transistors being coupled together and to the global bit line, and sources of the first and second transistors being coupled together and to a VSS voltage supply.

13. The method of claim 12 wherein m is an integer greater than 3.

14. The method of claim 12 wherein providing the memory array comprises providing memory bit cells with a single cell pitch height, and wherein the multiple input sense amplifier further comprises providing a multiple input sense amplifier with a pitch height less than or equal to the cell pitch height.

15. The method of claim 12 wherein the multiple input sense amplifier compares small signal voltages on the split bit lines one to another.

16. The method of claim 12, wherein the multiple input sense amplifier simultaneously logically compares the m split bit lines.

17. The integrated circuit of claim 7, wherein the first side logical gate comparator comprises a first NAND gate and the second side logical gate comparator comprises a second NAND gate.

18. A memory comprising:
   memory bit cells being arranged in rows and columns, the memory bit cells being divided into at least two sub-arrays, each column of each of the at least two sub-arrays being divided into m sections, m being at least two;
   m bit lines for each column of each of the at least two sub-arrays, the m bit lines being coupled to the memory bit cells in the respective column; and
   a sense amplifier for each column of the memory bit cells, the sense amplifier comprising:
      a first NAND gate and a second NAND gate, the first NAND gate having m inputs electrically connected to respective m bit lines of a first sub-array of the at least two sub-arrays, the second NAND gate having m inputs electrically connected to respective m bit lines of a second sub-array of the at least two sub-arrays; and
   a combination circuit for combining outputs of the first and second NAND gates to form a global bit line signal on a global bit line, the combination circuit comprising a first transistor having a gate coupled to the output of the first NAND gate and a second transistor having a gate coupled to the output of the second NAND gate, drains of the first and second transistors being coupled together and to the global bit line, and sources of the first and second transistors being coupled together and to a VSS voltage supply.

* * * * *